(12) United States Patent
Ahn et al.

(10) Patent No.: US 7,670,469 B2
(45) Date of Patent: *Mar. 2, 2010

(54) METHODS AND APPARATUS FOR MAKING INTEGRATED-CIRCUIT WIRING FROM COPPER, SILVER, GOLD, AND OTHER METALS

(75) Inventors: Kie Y. Ahn, Chappaqua, NY (US);
Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 194 days.

This patent is subject to a terminal disclaimer.

(21) Appl. No.: 11/861,927

(22) Filed: Sep. 26, 2007

(65) Prior Publication Data
US 2008/0067064 A1    Mar. 20, 2008

Related U.S. Application Data

(60) Continuation of application No. 10/842,042, filed on May 7, 2004, now Pat. No. 7,285,196, which is a continuation of application No. 10/211,855, filed on Aug. 1, 2002, now Pat. No. 6,756,298, which is a division of application No. 09/488,098, filed on Jan. 18, 2000, now Pat. No. 6,429,120.

(51) Int. Cl.
C23C 14/34     (2006.01)
C23C 16/00     (2006.01)

(52) U.S. Cl. ............................ 204/298.26; 204/298.07; 204/298.11; 204/298.02; 118/723 MP

(58) Field of Classification Search ............ 204/298.26, 204/298.07, 298.11, 298.02; 118/723 MP
See application file for complete search history.

(56) References Cited

U.S. PATENT DOCUMENTS 3,687,737 A    8/1972    Krock et al.

(Continued)

FOREIGN PATENT DOCUMENTS

EP              0304046           2/1989

(Continued)

OTHER PUBLICATIONS

U.S. Appl. No. 60/114,039, filed Dec. 29, 1998, Havemann, H. R., et al.

(Continued)

*Primary Examiner*—Rodney G McDonald
(74) *Attorney, Agent, or Firm*—Schwegman, Lundberg & Woessner, P.A.

(57) ABSTRACT

In recent years, copper wiring has emerged as a promising substitute for the aluminum wiring in integrated circuits, because copper offers lower electrical resistance and better reliability at smaller dimensions than aluminum. However, use of copper typically requires forming a diffusion barrier to prevent contamination of other parts of an integrated circuit and forming a seed layer to facilitate copper plating steps. Unfortunately, conventional methods of forming the diffusion barriers and seed layers require use of separate wafer-processing chambers, giving rise to transport delays and the introduction of defect-causing particles. Accordingly, the inventors devised unique wafer-processing chambers and methods of forming barrier and seed layers. One embodiment of the wafer-processing chamber includes equipment for physical vapor deposition and equipment for chemical vapor deposition to facilitate formation of diffusion barriers and seed layers within one chamber, thereby promoting fabrication efficiency and reducing defects.

21 Claims, 3 Drawing Sheets

U.S. PATENT DOCUMENTS

| | | | |
|---|---|---|---|
| 3,729,406 A * | 4/1973 | Osbourne et al. ...... 204/192.15 |
| 4,218,291 A * | 8/1980 | Fukuyama et al. ..... 204/192.25 |
| 4,565,157 A | 1/1986 | Brors et al. |
| 4,788,082 A | 11/1988 | Schmitt |
| 4,824,544 A | 4/1989 | Mikalesen et al. |
| 4,847,111 A | 7/1989 | Chow et al. |
| 4,857,481 A | 8/1989 | Tam et al. |
| 4,931,410 A | 6/1990 | Tokunaga et al. |
| 4,933,743 A | 6/1990 | Thomas et al. |
| 4,948,459 A | 8/1990 | Van Laarhoven et al. |
| 4,962,058 A | 10/1990 | Cronin et al. |
| 4,990,229 A | 2/1991 | Campbell et al. |
| 4,996,584 A | 2/1991 | Young et al. |
| 5,000,818 A | 3/1991 | Thomas et al. |
| 5,019,531 A | 5/1991 | Awaya et al. |
| 5,034,799 A | 7/1991 | Tomita et al. |
| 5,045,635 A | 9/1991 | Kaplo et al. |
| 5,071,518 A | 12/1991 | Pan |
| 5,084,412 A | 1/1992 | Nakasaki |
| 5,100,499 A | 3/1992 | Douglas |
| 5,130,274 A | 7/1992 | Harper et al. |
| 5,148,260 A | 9/1992 | Inoue et al. |
| 5,149,615 A | 9/1992 | Chakravorty et al. |
| 5,158,986 A | 10/1992 | Cha et al. |
| 5,171,712 A | 12/1992 | Wang et al. |
| 5,171,713 A | 12/1992 | Matthews |
| 5,173,442 A | 12/1992 | Carey |
| 5,227,658 A | 7/1993 | Beyer et al. |
| 5,231,036 A | 7/1993 | Miyauchi et al. |
| 5,231,056 A | 7/1993 | Sandhu |
| 5,232,866 A | 8/1993 | Beyer et al. |
| 5,240,878 A | 8/1993 | Fitzsimmons et al. |
| 5,243,222 A | 9/1993 | Harper et al. |
| 5,256,205 A | 10/1993 | Schmitt, III et al. |
| 5,268,315 A | 12/1993 | Prasad et al. |
| 5,308,440 A | 5/1994 | Chino et al. |
| 5,324,683 A | 6/1994 | Fitch et al. |
| 5,324,684 A | 6/1994 | Kermani et al. |
| 5,334,356 A | 8/1994 | Baldwin et al. |
| 5,336,914 A | 8/1994 | Andoh |
| 5,348,811 A | 9/1994 | Nagao et al. |
| 5,354,712 A | 10/1994 | Ho et al. |
| 5,356,672 A | 10/1994 | Schmitt, III et al. |
| 5,371,042 A | 12/1994 | Ong |
| 5,374,849 A | 12/1994 | Tada |
| 5,384,284 A | 1/1995 | Doan et al. |
| 5,399,897 A | 3/1995 | Cunningham et al. |
| 5,401,680 A | 3/1995 | Abt et al. |
| 5,408,742 A | 4/1995 | Zaidel et al. |
| 5,413,687 A | 5/1995 | Barton et al. |
| 5,413,962 A | 5/1995 | Lur et al. |
| 5,424,030 A | 6/1995 | Takahashi |
| 5,426,330 A | 6/1995 | Joshi et al. |
| 5,442,237 A | 8/1995 | Hughes et al. |
| 5,444,015 A | 8/1995 | Aitken et al. |
| 5,447,887 A | 9/1995 | Filipiak et al. |
| 5,451,804 A | 9/1995 | Lur et al. |
| 5,457,344 A | 10/1995 | Bartelink |
| 5,461,243 A | 10/1995 | Ek et al. |
| 5,470,789 A | 11/1995 | Misawa |
| 5,470,801 A | 11/1995 | Kapoor et al. |
| 5,476,817 A | 12/1995 | Numata |
| 5,485,037 A | 1/1996 | Marrs |
| 5,495,667 A | 3/1996 | Farnworth et al. |
| 5,506,449 A | 4/1996 | Nakano et al. |
| 5,510,645 A | 4/1996 | Fitch et al. |
| 5,529,956 A | 6/1996 | Morishita |
| 5,534,731 A | 7/1996 | Cheung |
| 5,538,922 A | 7/1996 | Cooper et al. |
| 5,539,060 A | 7/1996 | Tsunogae et al. |
| 5,539,227 A | 7/1996 | Nakano |
| 5,578,146 A | 11/1996 | Grant et al. |
| 5,595,937 A | 1/1997 | Mikagi |
| 5,609,721 A | 3/1997 | Tsukune et al. |
| 5,625,232 A | 4/1997 | Numata et al. |
| 5,625,233 A | 4/1997 | Cabral, Jr. et al. |
| 5,633,200 A | 5/1997 | Hu |
| 5,635,253 A | 6/1997 | Canaperi et al. |
| 5,635,423 A | 6/1997 | Huang et al. |
| 5,654,245 A | 8/1997 | Allen |
| 5,662,788 A | 9/1997 | Sandhu et al. |
| 5,667,600 A | 9/1997 | Grensing et al. |
| 5,668,398 A | 9/1997 | Havemann et al. |
| 5,670,420 A | 9/1997 | Choi |
| 5,674,787 A | 10/1997 | Zhao et al. |
| 5,675,187 A | 10/1997 | Numata et al. |
| 5,679,608 A | 10/1997 | Cheung et al. |
| 5,681,441 A | 10/1997 | Svendsen et al. |
| 5,693,563 A | 12/1997 | Teong |
| 5,695,810 A | 12/1997 | Dubin et al. |
| 5,705,425 A | 1/1998 | Miura et al. |
| 5,719,089 A | 2/1998 | Cherng et al. |
| 5,719,410 A | 2/1998 | Suehiro et al. |
| 5,719,447 A | 2/1998 | Gardner |
| 5,725,689 A | 3/1998 | Nishida et al. |
| 5,739,579 A | 4/1998 | Chiang et al. |
| 5,763,953 A | 6/1998 | Iljima et al. |
| 5,780,358 A | 7/1998 | Zhou |
| 5,785,570 A | 7/1998 | Bruni |
| 5,789,264 A | 8/1998 | Chung |
| 5,792,522 A | 8/1998 | Jin et al. |
| 5,792,706 A | 8/1998 | Michael et al. |
| 5,801,098 A | 9/1998 | Fiordalice et al. |
| 5,814,557 A | 9/1998 | Venkatraman et al. |
| 5,821,168 A | 10/1998 | Jain |
| 5,824,599 A | 10/1998 | Schacham-Diamond et al. |
| 5,840,625 A | 11/1998 | Feldner |
| 5,852,871 A | 12/1998 | Khandros |
| 5,858,877 A | 1/1999 | Dennison et al. |
| 5,880,018 A | 3/1999 | Boeck et al. |
| 5,889,295 A | 3/1999 | Rennie et al. |
| 5,891,797 A | 4/1999 | Farrar |
| 5,891,804 A | 4/1999 | Havemann et al. |
| 5,893,752 A | 4/1999 | Zhang et al. |
| 5,895,740 A | 4/1999 | Chien et al. |
| 5,897,370 A | 4/1999 | Joshi et al. |
| 5,899,740 A | 5/1999 | Kwon |
| 5,900,668 A | 5/1999 | Wollesen |
| 5,907,772 A | 5/1999 | Iwasaki |
| 5,911,113 A | 6/1999 | Yao et al. |
| 5,913,147 A | 6/1999 | Dubin et al. |
| 5,925,930 A | 7/1999 | Farnworth et al. |
| 5,930,596 A | 7/1999 | Klose et al. |
| 5,930,669 A | 7/1999 | Uzoh |
| 5,932,928 A | 8/1999 | Clampitt |
| 5,933,758 A | 8/1999 | Jain |
| 5,937,320 A | 8/1999 | Andricacos et al. |
| 5,939,771 A | 8/1999 | Usami |
| 5,940,733 A | 8/1999 | Beinglass et al. |
| 5,948,467 A | 9/1999 | Nguyen et al. |
| 5,953,626 A | 9/1999 | Hause et al. |
| 5,962,923 A | 10/1999 | Xu et al. |
| 5,968,327 A * | 10/1999 | Kobayashi et al. ..... 204/298.11 |
| 5,968,333 A | 10/1999 | Nogami et al. |
| 5,969,398 A | 10/1999 | Murakami |
| 5,969,422 A | 10/1999 | Ting et al. |
| 5,972,179 A | 10/1999 | Chittipeddi et al. |
| 5,972,804 A | 10/1999 | Tobin et al. |
| 5,976,710 A | 11/1999 | Sachdev et al. |
| 5,981,350 A | 11/1999 | Geusic et al. |
| 5,985,759 A | 11/1999 | Kim et al. |
| 5,985,762 A | 11/1999 | Geffken et al. |
| 5,989,623 A | 11/1999 | Chen et al. |
| 5,994,776 A | 11/1999 | Fang et al. |

| | | | | | | |
|---|---|---|---|---|---|---|
| 5,994,777 | A | 11/1999 | Farrar | 6,197,688 B1 | 3/2001 | Simpson |
| 6,001,730 | A | 12/1999 | Farkas et al. | 6,204,065 B1 | 3/2001 | Ochiai |
| 6,001,736 | A | 12/1999 | Kondo et al. | 6,204,096 B1 | 3/2001 | Lai et al. |
| 6,002,175 | A | 12/1999 | Maekawa | 6,204,174 B1 * | 3/2001 | Glew et al. .................. 438/680 |
| 6,004,884 | A | 12/1999 | Abraham | 6,207,222 B1 | 3/2001 | Chen et al. |
| 6,008,117 | A | 12/1999 | Hong et al. | 6,207,553 B1 | 3/2001 | Buynoski et al. |
| 6,015,465 | A | 1/2000 | Kholodenko et al. | 6,207,558 B1 | 3/2001 | Singhvi et al. |
| 6,015,738 | A | 1/2000 | Levy et al. | 6,208,016 B1 | 3/2001 | Farrar |
| 6,016,000 | A | 1/2000 | Moslehi | 6,211,049 B1 | 4/2001 | Farrar |
| 6,017,820 | A | 1/2000 | Ting et al. | 6,211,071 B1 | 4/2001 | Lukanc et al. |
| 6,020,243 | A | 2/2000 | Wallace et al. | 6,211,073 B1 | 4/2001 | Ahn |
| 6,022,802 | A | 2/2000 | Jang | 6,211,561 B1 | 4/2001 | Zhao |
| 6,025,261 | A | 2/2000 | Farrar et al. | 6,214,719 B1 | 4/2001 | Nag |
| 6,028,362 | A | 2/2000 | Omura | 6,215,186 B1 | 4/2001 | Konecni et al. |
| 6,030,877 | A | 2/2000 | Lee et al. | 6,218,282 B1 | 4/2001 | Buynoski |
| 6,030,895 | A | 2/2000 | Joshi et al. | 6,221,763 B1 | 4/2001 | Gilton |
| 6,037,248 | A | 3/2000 | Ahn | 6,224,690 B1 | 5/2001 | Andricacos et al. |
| 6,037,664 | A | 3/2000 | Zhao et al. | 6,228,754 B1 | 5/2001 | Iacoponi et al. |
| 6,051,858 | A | 4/2000 | Uchida et al. | 6,232,219 B1 | 5/2001 | Blalock et al. |
| 6,054,172 | A | 4/2000 | Robinson et al. | 6,232,230 B1 | 5/2001 | Iacoponi |
| 6,054,398 | A | 4/2000 | Pramanick | 6,239,017 B1 | 5/2001 | Lou et al. |
| 6,057,226 | A | 5/2000 | Wong | 6,245,658 B1 | 6/2001 | Buynoski |
| 6,059,553 | A | 5/2000 | Jin et al. | 6,245,662 B1 | 6/2001 | Naik et al. |
| 6,065,424 | A | 5/2000 | Shacham-Diamand et al. | 6,246,118 B1 | 6/2001 | Buynoski |
| 6,069,068 | A | 5/2000 | Rathore et al. | 6,249,055 B1 | 6/2001 | Dubin |
| 6,071,810 | A | 6/2000 | Wada et al. | 6,249,056 B1 | 6/2001 | Kwon et al. |
| 6,075,278 | A | 6/2000 | Farrar | 6,251,781 B1 | 6/2001 | Zhou et al. |
| 6,075,287 | A | 6/2000 | Ingraham et al. | 6,255,217 B1 | 7/2001 | Agnello et al. |
| 6,077,792 | A | 6/2000 | Farrar | 6,258,707 B1 | 7/2001 | Uzoh |
| 6,090,697 | A | 7/2000 | Xing et al. | 6,261,946 B1 | 7/2001 | Iacoponi et al. |
| 6,091,136 | A | 7/2000 | Jiang et al. | 6,262,376 B1 | 7/2001 | Hurwitz et al. |
| 6,091,475 | A | 7/2000 | Ogino et al. | 6,265,311 B1 | 7/2001 | Hautala et al. |
| 6,100,193 | A | 8/2000 | Suehiro et al. | 6,265,811 B1 | 7/2001 | Takeuchi et al. |
| 6,103,320 | A | 8/2000 | Matsumoto et al. | 6,268,276 B1 | 7/2001 | Chan et al. |
| 6,107,186 | A | 8/2000 | Erb | 6,268,277 B1 | 7/2001 | Bang |
| 6,117,781 | A | 9/2000 | Lukanc et al. | 6,271,592 B1 | 8/2001 | Kim et al. |
| 6,117,782 | A | 9/2000 | Lukanc | 6,277,263 B1 | 8/2001 | Chen |
| 6,120,641 | A | 9/2000 | Stevens et al. | 6,280,640 B1 | 8/2001 | Hurwitz et al. |
| 6,121,126 | A | 9/2000 | Ahn et al. | 6,281,585 B1 | 8/2001 | Bothra |
| 6,121,149 | A | 9/2000 | Lukanc et al. | 6,284,656 B1 | 9/2001 | Farrar |
| 6,121,150 | A | 9/2000 | Avanzino et al. | 6,287,954 B1 | 9/2001 | Ashley et al. |
| 6,126,989 | A | 10/2000 | Robinson et al. | 6,288,442 B1 | 9/2001 | Farrar |
| 6,136,095 | A | 10/2000 | Xu et al. | 6,288,447 B1 | 9/2001 | Amishiro et al. |
| 6,139,699 | A | 10/2000 | Chiang et al. | 6,288,905 B1 | 9/2001 | Chung |
| 6,140,228 | A | 10/2000 | Shan et al. | 6,290,833 B1 | 9/2001 | Chen |
| 6,140,234 | A | 10/2000 | Uzoh et al. | 6,303,498 B1 | 10/2001 | Chen et al. |
| 6,140,456 | A | 10/2000 | Lee et al. | 6,313,035 B1 | 11/2001 | Sandhu et al. |
| 6,143,604 | A | 11/2000 | Chiang et al. | 6,319,834 B1 | 11/2001 | Erb et al. |
| 6,143,641 | A | 11/2000 | Kitch | 6,323,543 B1 | 11/2001 | Jiang et al. |
| 6,143,646 | A | 11/2000 | Wetzel | 6,323,553 B1 | 11/2001 | Hsu et al. |
| 6,143,650 | A | 11/2000 | Pramanick et al. | 6,325,857 B1 * | 12/2001 | Miyoshi ..................... 118/724 |
| 6,143,655 | A | 11/2000 | Forbes et al. | 6,326,303 B1 | 12/2001 | Robinson et al. |
| 6,143,671 | A | 11/2000 | Sugai | 6,329,279 B1 | 12/2001 | Lee |
| 6,150,214 | A | 11/2000 | Kaeriyama | 6,333,255 B1 | 12/2001 | Sekiguchi |
| 6,150,261 | A | 11/2000 | Hsu et al. | 6,342,448 B1 | 1/2002 | Lin et al. |
| 6,153,507 | A | 11/2000 | Mikagi | 6,342,722 B1 | 1/2002 | Armacost et al. |
| 6,159,769 | A | 12/2000 | Farnworth et al. | 6,350,678 B1 | 2/2002 | Pramanick et al. |
| 6,159,842 | A | 12/2000 | Chang et al. | 6,350,687 B1 | 2/2002 | Avanzino et al. |
| 6,162,583 | A | 12/2000 | Yang et al. | 6,358,842 B1 | 3/2002 | Zhou et al. |
| 6,168,704 | B1 | 1/2001 | Brown et al. | 6,358,849 B1 | 3/2002 | Havemann et al. |
| 6,169,024 | B1 | 1/2001 | Hussein | 6,359,328 B1 | 3/2002 | Dubin |
| 6,171,661 | B1 | 1/2001 | Zheng et al. | 6,361,667 B1 | 3/2002 | Kobayashi et al. |
| 6,174,800 | B1 | 1/2001 | Jang | 6,365,511 B1 | 4/2002 | Kizilyalli et al. |
| 6,174,804 | B1 | 1/2001 | Hsu | 6,368,954 B1 | 4/2002 | Lopatin et al. |
| 6,177,350 | B1 | 1/2001 | Sundarrajan et al. | 6,368,965 B1 | 4/2002 | Lopatin |
| 6,181,012 | B1 | 1/2001 | Edelstein et al. | 6,368,966 B1 | 4/2002 | Krishnamoorthy et al. |
| 6,183,564 | B1 | 2/2001 | Reynolds et al. | 6,372,622 B1 | 4/2002 | Tan et al. |
| 6,184,121 | B1 | 2/2001 | Buchwalter et al. | 6,376,368 B1 | 4/2002 | Jung et al. |
| 6,187,656 | B1 | 2/2001 | Lu et al. | 6,376,370 B1 | 4/2002 | Farrar |
| 6,190,732 | B1 | 2/2001 | Omstead et al. | 6,383,920 B1 | 5/2002 | Wang et al. |
| 6,194,233 | B1 | 2/2001 | Bedner et al. | 6,387,542 B1 | 5/2002 | Kozlov et al. |
| 6,194,317 | B1 | 2/2001 | Kaisaki et al. | 6,399,489 B1 | 6/2002 | M'Saad et al. |
| 6,197,181 | B1 | 3/2001 | Chen | 6,403,481 B1 | 6/2002 | Matsuda et al. |

| | | |
|---|---|---|
| 6,410,418 B1 | 6/2002 | Yang |
| 6,410,442 B1 | 6/2002 | Yang |
| 6,413,827 B2 | 7/2002 | Farrar |
| 6,417,094 B1 | 7/2002 | Zhao et al. |
| 6,420,262 B1 | 7/2002 | Farrar |
| 6,420,702 B1 | 7/2002 | Tripsas et al. |
| 6,426,289 B1 | 7/2002 | Farrar |
| 6,428,673 B1 | 8/2002 | Ritzdorf et al. |
| 6,429,120 B1 | 8/2002 | Ahn et al. |
| 6,448,331 B1 | 9/2002 | Ioka et al. |
| 6,486,533 B2 | 11/2002 | Krishnamoorthy et al. |
| 6,492,266 B1 | 12/2002 | Ngo et al. |
| 6,495,445 B2 | 12/2002 | Clevenger et al. |
| 6,503,796 B1 | 1/2003 | Tu |
| 6,508,920 B1 | 1/2003 | Ritzdorf et al. |
| 6,515,323 B1 | 2/2003 | Jung et al. |
| 6,518,173 B2 | 2/2003 | Chan |
| 6,518,198 B1 | 2/2003 | Klein |
| 6,552,432 B2 | 4/2003 | Farrar |
| 6,562,416 B2 | 5/2003 | Ngo et al. |
| 6,563,219 B2 | 5/2003 | Ireland et al. |
| 6,565,729 B2 | 5/2003 | Chen et al. |
| 6,573,182 B2 | 6/2003 | Sandhu et al. |
| 6,576,982 B1 | 6/2003 | You et al. |
| 6,589,863 B1 | 7/2003 | Usami |
| 6,614,099 B2 | 9/2003 | Farrar |
| 6,632,345 B1 | 10/2003 | Chen |
| 6,633,074 B2 | 10/2003 | Ahn |
| 6,635,570 B1 * | 10/2003 | Galewski et al. ............ 438/681 |
| 6,638,410 B2 | 10/2003 | Chen et al. |
| 6,646,347 B2 | 11/2003 | Mercado et al. |
| 6,664,197 B2 | 12/2003 | Stevens et al. |
| 6,674,167 B1 | 1/2004 | Ahn et al. |
| 6,674,169 B2 | 1/2004 | Sandhu et al. |
| 6,709,919 B2 | 3/2004 | Tu |
| 6,710,447 B1 | 3/2004 | Nogami |
| 6,737,725 B2 | 5/2004 | Grill et al. |
| 6,740,392 B1 | 5/2004 | Farrar |
| 6,743,716 B2 | 6/2004 | Farrar |
| 6,756,298 B2 | 6/2004 | Ahn et al. |
| 6,803,309 B2 | 10/2004 | Chou et al. |
| 6,833,289 B2 | 12/2004 | Hu et al. |
| 6,846,756 B2 | 1/2005 | Pan et al. |
| 6,849,927 B2 | 2/2005 | Farrar |
| 6,888,246 B2 | 5/2005 | Mercado et al. |
| 6,943,090 B2 | 9/2005 | Farrar |
| 6,984,891 B2 | 1/2006 | Ahn et al. |
| 7,067,421 B2 | 6/2006 | Ahn et al. |
| 7,105,914 B2 | 9/2006 | Farrar |
| 7,211,512 B1 | 5/2007 | Ahn et al. |
| 7,220,665 B2 | 5/2007 | Farrar |
| 7,253,521 B2 | 8/2007 | Ahn et al. |
| 7,262,130 B1 | 8/2007 | Ahn et al. |
| 7,262,505 B2 | 8/2007 | Ahn et al. |
| 7,285,196 B2 | 10/2007 | Ahn et al. |
| 2002/0014646 A1 | 2/2002 | Tsu et al. |
| 2002/0028552 A1 | 3/2002 | Lee et al. |
| 2002/0096768 A1 | 7/2002 | Joshi |
| 2002/0109233 A1 | 8/2002 | Farrar |
| 2002/0167089 A1 | 11/2002 | Ahn et al. |
| 2004/0206308 A1 | 10/2004 | Ahn et al. |

FOREIGN PATENT DOCUMENTS

| | | | |
|---|---|---|---|
| EP | 0808915 A2 | | 11/1997 |
| JP | 62-239526 | * | 10/1987 |
| JP | 5-267643 | | 10/1993 |
| JP | 05267643 | | 10/1993 |
| JP | 05-295533 | | 11/1993 |
| JP | 05160826 | | 3/1995 |
| JP | 07-321111 | | 8/1995 |

OTHER PUBLICATIONS

*Machine Translation of 05-295533*, http://www4.ipdl.ncipi.go.jp/cgi-bin/tran_web_cgi_ejje?, 2.

Application Partial File History U.S. Appl. No. 09/488,098, (Downloaded from FIP database Oct. 23, 2007),56 pgs.

Application Partial File History U.S. Appl. No. 09/854,540 Downloaded from IFW PAIR, (Downloaded Oct. 25, 2007),40 pgs.

Application Partial File History U.S. Appl. No. 09/901,001, (Downloaded Oct. 25, 2007),85 pgs.

Application Partial File History U.S. Appl. No. 10/211,855, (Downloaded from FIP database Oct. 23, 2007),45 pgs.

Application Partial File History U.S. Appl. No. 10/842,042, (Downloaded Oct. 23, 2007),182 pgs.

Application Partial File History U.S. Appl. No. 10/842,243 Downloaded from IFW PAIR, (Downloaded Oct. 25, 2007),36 pgs.

Application Partial Prosecution History U.S. Appl. No. 09/032,197, (Downloaded Oct. 25, 2007),47 pgs.

"Brooks Model 5964 High Performance Metal Seal Mass Flow Controller (Introduced in 1991)", *Brooks Instrument*, http://www.frco.com/brooks/semiconductor/products1i.html,(1991),1 page.

Abe, K. , et al., "Sub-half Micron Copper Interconnects Using Reflow of Sputtered Copper Films", *VLSI Multilevel Interconnection Conference*, (Jun. 25-27, 1995),308-311.

American Society for Metals, "Metals Handbook", *Properties and Selection: Nonferrous Alloys and Pure Metals*, Ninth Edition, vol. 2, Metals Park, Ohio : American Society for Metals,(1989), 157, 395.

Bai, G. , "Copper Interconnection Deposition Techniques and Integration", *1996 Symposium on VLSI Technology*, Digest of Technical Papers,(1996),48-49.

Bernier, M. , et al., "Laser processing of palladium for selective electroless copper plating", *SPIE*, 2045, (1994),330-337.

Craig, J. D., "Polymide Coatings", *Packaging, Electronic Materials Handbook*, vol. 1, ASM International Handbook Committee (eds.), ASM International, Materials Park, OH,(1989),767-772.

Dow Company, "SiLK * D Semiconductor Dielectric Resin", http://www.dow.com/silk/pdf/618-00317.pdf, (Unknown),2 pages.

Dow Company, "SiLK * J Semiconductor Dielectric Resin", http://www.dow.com/silk/pdf/618-00316.pdf, (unknown),2 pages.

Edelstein, D. , "Full Copper Wiring in a Sub-0.25 micrometer CMOS ULSI Technology", *Technical Digest., International Electron Devices Meeting*, (Dec. 7-10, 1997),773-776.

Eisenbraun, E. T., et al., "Selective and Blanket Low-Temperature Copper CVD for Multilevel Metallization in ULSI", *Conference Proceedings ULSI-VII*, (1992),5 pages.

Ernst, et al., "Growth Model for Metal Films on Oxide Surface: Cu on ZnO(0001)-O", *Physical Review B*, 47 (May 15, 1993),13782-13796.

Fukuda, T. , et al., "0.5 -micrometer-Pitch Copper-Dual-Damascene Metallization Using Organic SOG (k=2.9) for 0.18-micrometer CMOS Applications", *Electron Devices Meeting, 1999. IEDM Technical Digest. International*, (1999),619-622.

Hirao, S. , et al., "A Novel Copper Reflow Process Using Dual Wetting Layers", *Symposium on VLSI Technology*, Digest of Technical Papers,(1997),57-58.

Hirao, S. , et al., "A Novel Copper Reflow Process Using Dual Wetting Layers", *1997 Symposium on VLSI Technology*, Digest of Technical Papers,(1997),57-58.

Hirata, A. , et al., "WSiN Diffusion Barrier Formed by ECR Plasma Nitridation for Copper Damascene Interconnection", *16th Solid State Devices and Materials*, (1998),pp. 260-261.

Hu, C. K., et al., "Extendibility of Cu Damascene to 0.1 micrometer Wide Interconnections", *Mat. Res. Soc. Symp. Proc*, 514, (1998),287-292.

Izaki, M. , et al., "Characterization of Transparent Zinc Oxide Films Prepared by Electrochemical Reaction", *Journal of the Electrochemical Society*, 144, (Jun. 1997),1949-1952.

Kaloyeros, A. E., et al., "Blanket and Selective Copper CVD from Cu(FOD)2 for Multilivel Metallization", *Mat. Res. Soc. Symp. Proc.*, vol. 181,(1990),6 pages.

Kang, H. K., et al., "Grain Structure and Electromigration Properties of CVD CU Metallization", *Proceedings of the 10th International VLSI Multilevel Interconnection Conference*, (Jun. 8-9, 1993),223-229.

Klaus, J W., "Atomic layer deposition of tungsten nitride films using sequential surface reactions", *Journal of the Electrochemical Society*, vol. 147, No. 3, (Mar. 2000),1175-1181.

Martin, Steven J., "The Invention and Development of a Low-Dielectric Constant Polymer for the Fabrication of Integrated Circuit Interconnect", *Seminar—Department of Chemical Engineering—North Carolina State University*, (Apr. 9, 2001),1 page.

Min, J., "Metal-organic atomic-layer deposition of titanium-silicon-nitride films", *Applied Physics Letters*, 75(11), (1999),1521-1523.

Miyake, T., et al., "Atomic Hydrogen Enhanced Reflow of Copper", *Applied Physics Letters*, 70(10), (1997),1239-1241.

Murarka, S. P., et al., "Copper Metallization for ULSI and Beyond", *Critical Reviews in Solid State and Materials Sciences*, 20(2), (1995),87-124.

Nakao, S., et al., "Thin and Low-Resistivity Tantalum Nitride Diffusion Barrier and Giant-Grain Copper Interconnects for Advanced ULSI Metallization", *Japanese Journal of Applied Physics*, 38 (4B), (Apr. 1999),pp. 262-263.

Newboe, B., et al., "Applied Materials Announces First Barrier/Seed Layer System For Copper Interconnects", *Applied Materials*, http://www.appliedmaterials.com/newsroom/pr-00103.html,(1997),pp. 1-4.

Park, C. W., et al., "Activation Energy for Electromigration in Cu Films", *Applied Physics Letters*, 59(2), (Jul. 6, 1991),175-177.

Radzimski, Z. J., et al., "Directional Copper Deposition using d-c Magnetron Self-sputtering", *J. Vac. Sci. Technol. B*, 16(3), (1998),pp. 1102-1106.

Rossnagel, S. M., "Magnetron Sputter Deposition of Interconnect Applications", *Conference Proceedings, ULSI XI*, (1996),227-232.

Rossnagel, S. M., et al., "Metal ion deposition from ionized mangetron sputtering discharge", *J. Vac. Sci. Technol. B*, 12(1), (1994),pp. 449-453.

Ryan, J. G., "Copper Interconnects for Advanced Logic and DRAM", Extended Abstracts of the 1998 International Conference on Solid-State Devices and Materials, Hiroshima,(1998),pp. 258-259.

Senzaki, Y., "Chemical Vapor Deposition of Copper using a New Liquid Precursor with Improved Thermal Stability", *Conference Proceedings ULSI XIII, Materials Research Society*, (1998),pp. 451-455.

Srivatsa, A. R., et al., "Jet Vapor Deposition: an Alternative to Electrodeposition", *Surface Engineering*, 11, (1995),75-77.

Tao, J., et al., "Electromigration Characteristics of Copper Interconnects", *IEEE Electron Devices Letters*, 14(5), (May 1993),249-251.

Venkatesan, S., et al., "A High Performance 1.8V, 0.20 micrometer CMOS Technology with Copper Metalization", *Electron Devices Meeting, 1997. Technical Digest., International*, (Dec. 7-10, 1997),769-772.

Venkatesan, S., "A High Performance 1.8V, 0.20 micrometer CMOS Technology with Copper Metallization", *IEEE*, (1997),pp. 769-772.

Wang, X. W., et al., "Highly Reliable Silicon Nitride Thin Films Made by Jet Vapor Deposition", *Japanese Journal of Applied Physics*, vol. 34, Part1, No. 2B, (Feb. 1995),955-958.

Zhang, F, "Nanoglass/sup TM/ E copper damascene processing for etch, clean, and CMP", *Proceedings of the IEEE 2001 International Interconnect Technology Conference*, (2001),57-9.

US 7,078,338, 07/2006, Ahn et al. (withdrawn)

* cited by examiner

METHODS AND APPARATUS FOR MAKING INTEGRATED-CIRCUIT WIRING FROM COPPER, SILVER, GOLD, AND OTHER METALS

CROSS-REFERENCE TO RELATED APPLICATION(S)

This patent application is a continuation of U.S. application Ser. No. 10/842,042 filed May 7, 2004 now U.S. Pat. No. 7,285,196, which is a continuation of U.S. application Ser. No. 10/211,855, filed on Aug. 1, 2002, now issued as U.S. Pat. No. 6,756,298, which is a division of U.S. application Ser. No. 09/488,098, filed on Jan. 18, 2000, now issued as U.S. Pat. No. 6,429,120; the specifications of which are hereby incorporated by reference.

TECHNICAL FIELD

The present invention concerns methods of semiconductor device or integrated circuit manufacturing, particularly methods of forming interconnects from copper and other metals.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then wired, or interconnected, together with aluminum wires to define a specific electric circuit, such as a computer memory.

To form the aluminum wires, fabricators sometimes use a dual-damascene metallization technique, which takes its name from the ancient Damascan metalworking art of inlaying metal in grooves or channels to form ornamental patterns. The dual-damascene technique entails covering the components on a wafer with an insulative layer of silicon dioxide, etching small holes in the insulative layer to expose portions of the components underneath, and subsequently etching shallow trenches from hole to hole to define a wiring pattern. Fabricators then blanket the entire insulative layer with a thin sheet of aluminum and polish off the excess, leaving behind aluminum vias, or contact plugs, in the holes and thin aluminum wires in the trenches. The aluminum wires are typically about one micron thick, or about 100 times thinner than a human hair.

In recent years, researchers have begun using copper instead of aluminum to form integrated-circuit wiring, because copper offers lower electrical resistance and better reliability at smaller dimensions. See, for example, D. Edelstein et al., Full Copper Wiring in a Sub-0.25 um CMOS ULSI Technology, Technical Digest of 1997 IEDM, p. 773-776, 1997; and S. Venkatesan et al., A High Performance 1.8V, 0.20 um CMOS Technology with Copper Metallization, Technical Digest of 1997 IEDM, p. 769-772, 1997. Moreover, Applied Materials, Inc., a maker of semiconductor fabrication equipment, reports special equipment for fabricating copper-wired integrated circuits. (Applied Materials Announces First Barrier/Seed Layer System for Copper Interconnects, http://www.appliedmaterials.com/newsroom/pr-00103.html, Dec. 2, 1997.)

These copper-wired integrated circuits typically follow a variation of the dual-damascene method, which entails forming a copper-diffusion barrier in holes and trenches prior to filling them with copper. The typical copper-diffusion barrier is more than 30-nanometers thick and consists of tantalum (Ta), tantalum nitride (TaN), tantalum silicon nitride (TaSiN), titanium nitride (TiN), or tungsten nitride (WN). Filling the barrier-lined holes and trenches with copper generally entails forming a thin copper seed layer on the copper-diffusion barrier and then electroplating copper on the seed layer to finish.

The present inventors identified at least two problems with current techniques for making the copper wiring. The first is that typical copper-diffusion barriers add appreciable resistance to the copper wiring, and thus negate some of the advantages of using copper. The second concerns the use of separate wafer-processing chambers to form the copper-diffusion barrier and the copper seed layer. Using two chambers means that wafers are processed in one chamber to form the diffusion barrier and then transported to another chamber to form the seed layer. However, moving wafers from one chamber to another not only slows down fabrication, but also risks the addition of undesirable particles to the wafers, some of which can cause defects in resulting integrated circuits.

Accordingly, there is a need for better ways of making copper wiring in integrated circuits.

SUMMARY OF THE INVENTION

To address these and other needs, the inventors devised unique wafer-processing chambers and methods of forming barrier and seed layers. One embodiment of the wafer-processing chamber includes equipment for physical vapor deposition and equipment for chemical vapor deposition, two processes which facilitate formation of copper-diffusion barriers and seed layers within the chamber. One of the unique methods of forming barrier and seed layers entails forming a graded composition of tungsten silicide ($WSi_x$), nitriding the graded composition, and then depositing a copper seed layer on the nitrided composition, all within a single wafer-processing chamber to promote fabrication efficiency and reduce defects.

DESCRIPTION OF THE PREFERRED EMBODIMENTS

The following detailed description, which references and incorporates FIGS. 1-6, describes and illustrates specific embodiments of the invention. These embodiments, offered not to limit but only to exemplify and teach the concepts of the invention, are shown and described in sufficient detail to enable those skilled in the art to implement or practice the invention. Thus, where appropriate to avoid obscuring the invention, the description may omit certain information known to those of skill in the art.

Figure 1:
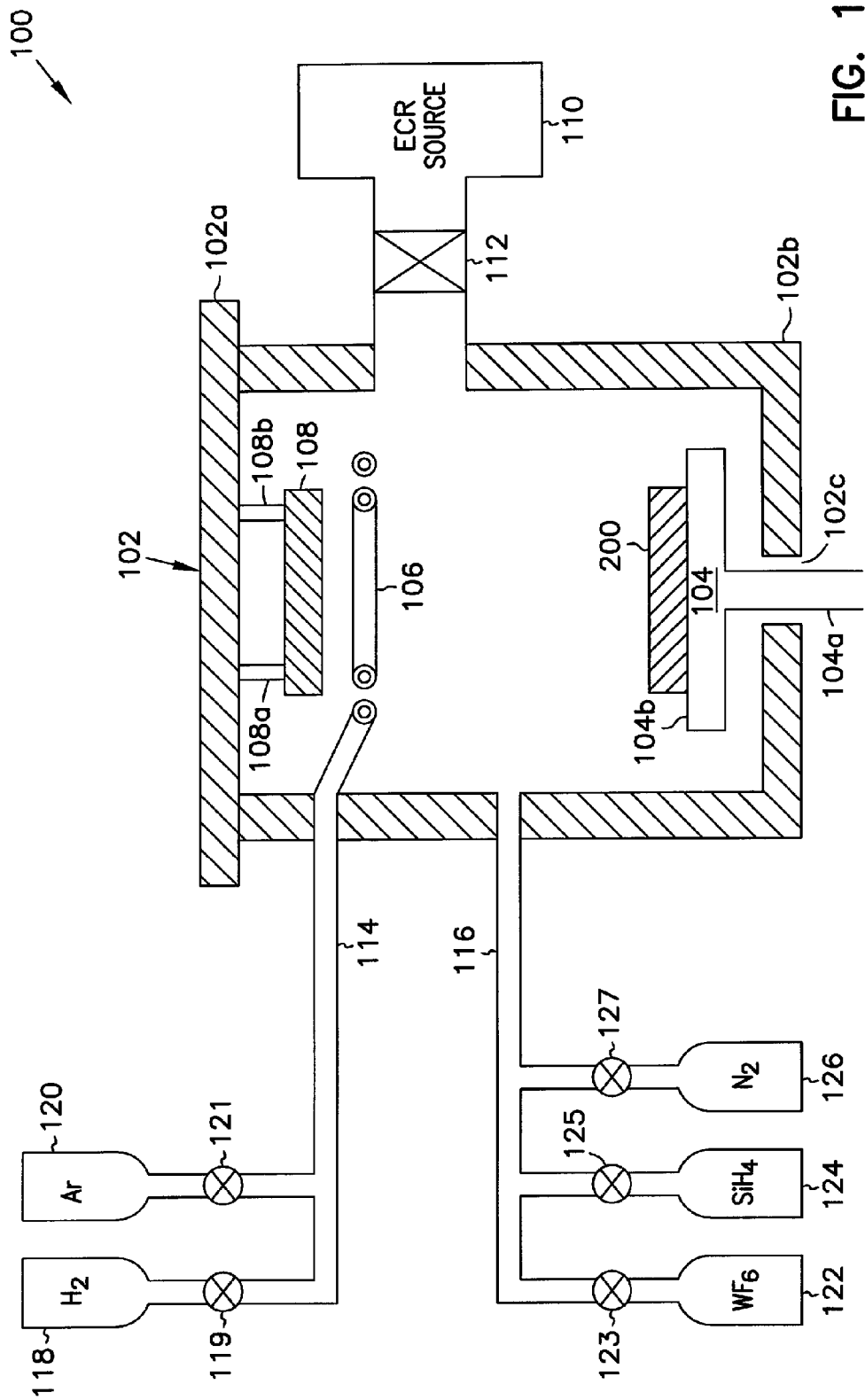
FIG. 1 is a schematic side-view of an exemplary wafer-processing chamber 100 in accord with the present invention.

FIG. 1 shows an exemplary wafer-processing apparatus or system 100 which incorporates teachings of the present invention. In particular, system 100 includes a chamber 102, a wafer holder 104, an RF-gas-emission coil 106, a sputter target 108, an electron-cylotron-resonance (ECR) source 110, an isolation valve 112, gas inlets 114 and 116, gas (or more generally fluid) sources 118, 120, 122, 124, and 126, and mass-flow controllers 119, 121, 123, 125, and 127.

More particularly, chamber 102 includes respective top and bottom plates 102a and 102b. In the exemplary embodiment, chamber 102 is a cylindrical structure formed of stainless steel or glass. However, other embodiments use different structures and materials. Bottom plate 102b includes an opening 102c which is coupled to a vacuum pump (not shown). Extending through opening 102c is a stem portion 104a of wafer holder 104.

Wafer holder 104 also includes a support platform 104b which supports one or more wafers or integrated-circuit assemblies 200. Holder 104 is coupled through opening 102c to a power supply (not shown.) In the exemplary embodiment, wafer holder 104, which is rotatable either manually or automatically, includes internal heating elements (not shown) for heating wafers or assemblies 200 to a desired temperature. In some embodiments, wafer holder 104 is a planetary wafer holder.

Above wafer holder 104 is RF-gas-emission coil 106, which includes one or more turns or loops of electrically conductive tubing. Coil 106, which is selectively couplable to a power supply (not shown), also includes a number of orifices (not shown) for emitting gas toward sputter target 108 or to a position where sputter target 108 is to be installed.

In the exemplary embodiment, the coil turns define a horizontal spiral; however, in other embodiments, the turns define a helical or vertical spiral. Other embodiments use horizontal or vertical spirals with the coils having regular or irregular polygonal forms. The exemplary embodiment constructs coil 106 as two turns of 6.5-millimeter-diameter tubing, with the "diameter" of the turns being greater than the width or diameter of wafer 200. However, other embodiments use tubing with regular or irregular polygonal cross-sections, for example, triangular, square, or elliptical. The exemplary orifices have a common diameter of 50 microns and are spaced about two-to-three centimeters apart along the turns of the coil. The diameter of the entire coil is generally large enough to encircle wafer holder 104; however, some embodiments use smaller or larger coils. Also, the exemplary coil 106 consists of the same material as sputter target 108.

Sputter target 108, which is positioned above coil 106, is fixed to top plate 102a via target holders 108a and 108b. Target 108 consists of a material intended for deposition on wafer 200. The exemplary embodiment implements target 108 as a slab of copper with a circular or rectangular shape. However, the invention is not limited to any type, form, or shape of target material. In some embodiments, target 108 is coupled to a power supply (not shown), which biases it to a specific voltage level, for example, a positive, negative, or ground voltage.

In addition to chamber 102, wafer holder 104, RF-gas-emission coil 106, and sputter target 108, wafer-processing apparatus 100 also includes ECR source 110, isolation valve 112, gas inlets 114 and 116, gas sources 118-126, and mass-flow controllers 119-127. ECR source 110 is selectively isolatable from the interior of chamber 102 using isolation valve 112. When isolation value 112 is open, ECR source 110 can inject a high-energy plasma into chamber 102. Isolation value 112 may assume any suitable manual or motor-actuated form, such as gate valve, butter-fly valve, etc.

Gas sources 118-126 are coupled respectively via mass-flow controllers 119-127 to one of gas inlets 114 and 116. More particularly, sources 118 and 120 are coupled via respective controllers 119 and 121 to inlet 114. Inlet 114 is coupled to coil 106. Sources 122, 124, and 126 are coupled via respective controllers 123, 125, and 127 to inlet 116.

The exemplary mass-flow controllers are thermal or pressure based; however, the invention is not limited to any particular number or type of mass-flow controller. Additionally, in the exemplary embodiment, gas source 118 supplies hydrogen ($H_2$) gas; source 120 supplies argon (Ar) gas; source 122 supplies tungsten hexaflouride ($WF_6$) gas; source 124 supplies silane ($SiH_4$) gas; and source 126 supplies nitrogen ($N_2$) gas. However, the invention is not limited to any particular number or set of gas sources.

In general operation, apparatus 100 functions, via manual or automatic control, to apply material through physical or chemical vapor deposition onto wafer 200. During physical vapor deposition (PVD) (more commonly known as sputtering), isolation valve 112 is open, enabling ions from ECR source 110 into the chamber. In turn, these ions dislodge matter from sputter target 108 onto wafer 200. During chemical vapor deposition, valve 112 is closed and gases from one or more of the gases sources, for example, $WF_6$ and $SiH_4$, are introduced into the chamber to chemically react and deposit a precipitant on wafers 200. Additionally, to avoid contaminating sputter target 108 during this operation, coil 106 rapidly emits through its orifices a gas, for example hydrogen gas on sputter target 108. The gas sweeps the surface of sputter target 108, preventing its contamination during the chemical-vapor deposition (CVD.) As a further or alternative anti-contamination measure, some embodiments bias sputter target 108 to a low voltage.

Figure 2:
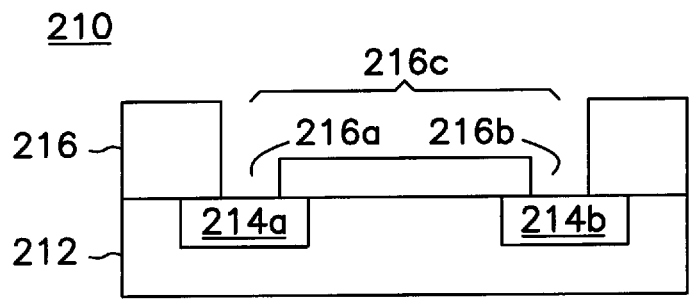
FIG. 2 is a cross-sectional view of an exemplary integrated-circuit assembly 210, including two transistors 214a and 214b and an insulative layer 216 with via holes 216a and 216b, and a trench 216c.

More particularly, FIGS. 2-5 show several partial cross-sectional views of wafer 200, which taken collectively and sequentially, illustrate a unique exemplary method of using apparatus 100 to form diffusion-barrier and seed layers, useful in forming copper, silver, or gold interconnects. The method, as shown in FIG. 2, begins with a known integrated-circuit assembly or structure 210, which can be within any integrated circuit, a dynamic-random-access memory, for example. Assembly 210 includes a substrate 212.

The term "substrate," as used herein, encompasses a semiconductor wafer as well as structures having one or more insulative, conductive, or semiconductive layers and materials. Thus, for example, the term embraces silicon-on-insulator, silicon-on-sapphire, and other advanced structures.

Figure 3:
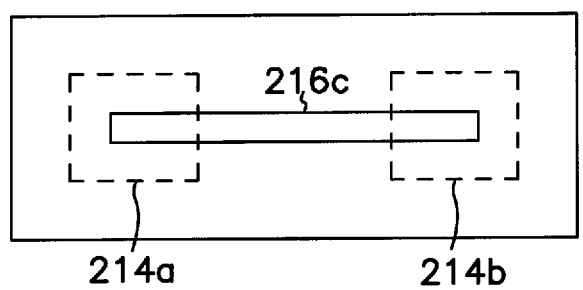
FIG. 3 is a top view of the FIG. 2 assembly, showing relative position of trench 216c and transistors 214a and 214b.

Substrate 212 supports a number of integrated elements 214, for example transistors 214a and 214b. Transistors 214a and 214b are covered by an insulative layer 216, which, for example comprises silicon oxide, nitride, oxynitride, and polymeric materials. Layer 216 includes two exemplary via holes 216a and 216b positioned over respective transistors 214a and 214b and a trench 216c connecting the via holes. FIG. 3 shows a top view of the assembly, further illustrating the relative position of the trench and via holes relative the transistors.

The exemplary embodiment forms layer 216 using deposition, lithographic, and selective-material-removal techniques, such as reactive-ion etching. In the exemplary embodiment, via holes 216a and 216b are cylindrical with diameters of about 1000 nanometers and depths of about 500 nanometers. Trench 216c is less than 0.50 microns wide and at least one micron deep. The invention, however, is not limited to any particular insulative composition(s) or hole and trench dimensions.

Figure 4:
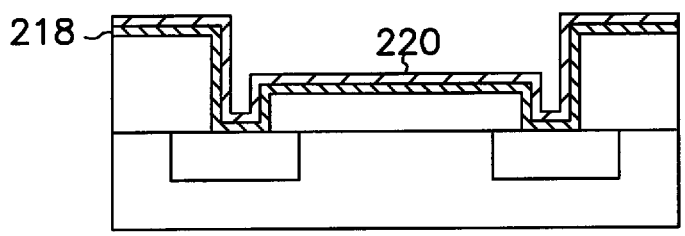
FIG. 4 is a cross-sectional view of the FIG. 2 assembly after formation of diffusion barrier 218 and a seed layer 220.

Next, as shown in FIG. 4, the exemplary method forms a two-to-six-nanometer-thick diffusion barrier 218 over layer 216 within holes 216a, 216b, and trench 216c, more precisely on the floor and sidewalls of these structures. In the exemplary embodiment, forming the diffusion barrier entails inserting wafer 200 into chamber 102 of apparatus 100 and using the apparatus in a CVD mode to form a graded composition of tungsten silicide ($WSi_x$), with x varying from 2.0 to 2.5. This entails heating wafer 200 to a temperature of 360° C. and introducing hydrogen, tungsten hexafluoride, and silane gases into chamber 102 using respective mass-flow controllers 119, 123, and 125.

The exemplary embodiment introduces the hydrogen and tungsten hexaflouride gases about one-to-three seconds before introducing the silane gas and stops introducing the silane gas about one-to-three seconds before stopping introduction of the hydrogen and tungsten hexaflouride. Note that the exemplary embodiment introduces hydrogen through coil 106, for example at 1000 sccm milligrams per second or cubic centimeters per second, to prevent contamination of sputter target 108. Exemplary flow rates for the silane and tungsten hexaflouride gases are respectively 1000 sccm and 14 sccm. These flow rates result in a composition of $WSi_{2.3}$, with a growth rate of approximately 50 nanometers per minute.

To complete the diffusion barrier, the exemplary method nitrides the graded composition of $WSi_x$, forming $WSi_xN_y$. The exemplary nitridation uses apparatus 100 in a PVD mode, following an ECR plasma nitridation procedure. One version of this method is described in A. Hirata et al., WSiN Diffusion Barrier Formed by ECR Plasma Nitridation for Copper Damascene Interconnection, Extended Abstracts of 1998 International Conference on Solid State Devices and Materials, p. 260-261, which is incorporated herein by reference. This entails operating mass-flow controller 121 to introduce argon gas through coil 106 into chamber 102 and thereby excite plasma generated via ECR source 110 and the introduction of nitrogen gas through inlet 116, using mass-flow controller 127. In the exemplary embodiment, the WSiN is not a compound-forming barrier, but a stuffed barrier, which prevents diffusion by stuffing nitrogen atoms into diffusion paths, such as interstitial sites, within the tungsten silicide.

FIG. 4 shows that after forming diffusion barrier 218, the exemplary method forms a seed layer 220 of, for example, copper-, silver-, or gold-based material on top of the diffusion barrier. (As used herein, copper-, silver-, or gold-based material includes any material comprising a substantial amount of copper, silver, or gold. For example, materials containing ten or more percent (by weight) of copper, silver, or gold constitute a copper, silver, or gold-based material.) The exemplary method uses a chemical-vapor-deposition, ionized-sputtering, or DC-magnetron self-sputtering technique to form the seed layer within chamber 102, thereby forming seed layer 220 within chamber 102 avoids the delay and contamination risk of conventional practices which transport the wafer from the chamber used for barrier formation to a separate chamber for seed-layer formation.

The exemplary chemical-vapor-deposition technique follows a procedure such as that described in Y. Senzaki, "Chemical Vapor Deposition of Copper Using a New Liquid Precursor with Improved Thermal Stability," MRS Conference Proceedings of Advanced Metallization and Interconnect Systems for ULSI Applications in 1997, ULSI XIII, P. 451-455, 1998, which is incorporated herein by reference. This procedure yields copper films at a typical deposition rate of 150-170 nanometers per minute at wafer temperatures of 195-225° C. The resistance of these films falls in the range of 2.0 micro-ohm-centimeter after annealing at 400° C. for about five minutes.

In the exemplary embodiment, the ionized sputtering technique and DC magnetron sputtering techniques follow procedures similar to those outlined in S. M. Rossnagel et al., Metal Ion Deposition from Ionized Magnetron Sputtering Discharge," J. Vac. Sci. Technology B, 12(1), p. 449-453, 1994. And Z. J Radzimski et al, "Directional Copper Deposition using D-C Magnetron Self-sputtering," J. Vac. Sci Technology B 16(3), p. 1102-1106, 1998. Exemplary conditions for the ionized-magnetron sputtering include target power range of 10-30 kilowatts for a 200-300 millimeter diameter wafer (or integrated-circuit assembly), RF coil power of 3-5 kilowatts, negative DC bias of 100-200 volts, sputtering argon gas pressurized at 1-35 millitorrs. Ionized-magnetron sputtering, which provides greater acceleration of the metal deposition material than conventional sputtering, forces the metal to more closely conform to the interior profiles of holes and trenches and thus facilitates formation of a conductive structure with less electrical resistance.

Figure 5:
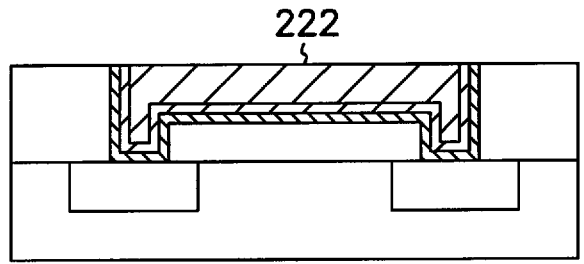
FIG. 5 is a cross-sectional view of the FIG. 4 assembly after formation of a conductive structure 222 on seed layer 220.

After completion of seed layer 220, the exemplary method removes wafer 200 from chamber 102 and completes filling the holes and trenches with a conductive material, for example, a copper-, silver-, or gold-based material, as indicated in FIG. 5. (Some embodiments use a different materials for the seed layer and the subsequent conductive fill material.) The exemplary method completes the filling through electroplating of copper onto the seed layer. Mechanical, chemical, or chemical-mechanical planarization then removes any excess metal, ensuring a substantially planar surface for formation of subsequent metallization levels according to the same or alternative procedures.

Figure 6:
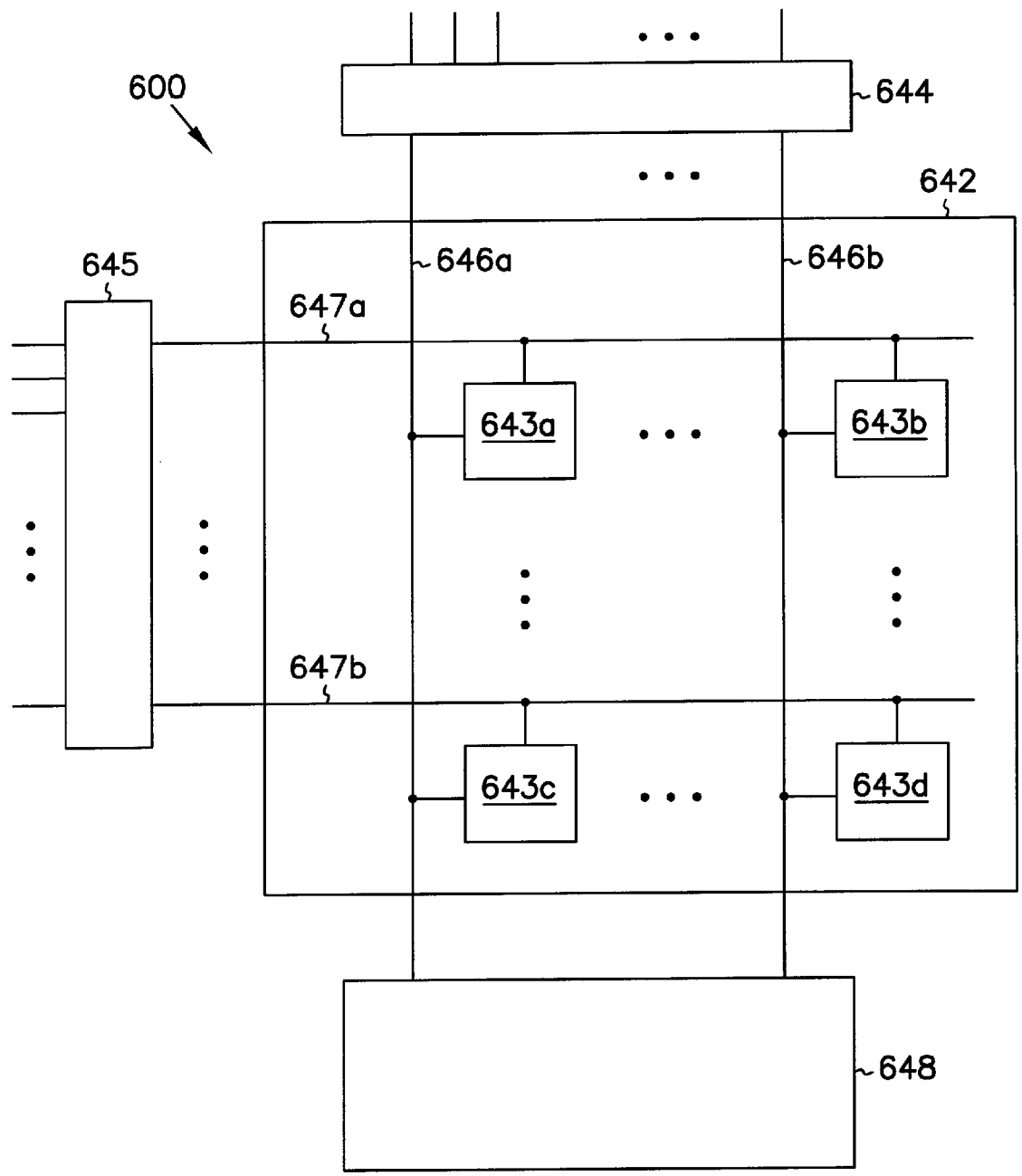
FIG. 6 is a block diagram of an exemplary integrated memory circuit which incorporates the present invention.

FIG. 6 shows one example of the unlimited number of applications for the interconnections of the present invention: a generic integrated memory circuit 600. Circuit 600, which operates according to well-known and understood principles, is generally coupled to a processor (not shown) to form a computer system. More precisely, circuit 600 includes a memory array 642 which comprises a number of memory cells 643a-643d, a column address decoder 644, and a row address decoder 645, bit lines 646a-b, word lines 647a-b, and voltage-sense-amplifier circuit 648 coupled to bit lines 646a-b.

In the exemplary embodiment, each of the memory cells, the address decoders, and the amplifier circuit includes one or more copper-, silver, or gold-based conductors according to the present invention. Other embodiments, use conductors of other materials, made in accord with methods of the present invention In addition, connections between the address decoders, the memory array, the amplifier circuit are implemented using similar interconnects.

CONCLUSION

In furtherance of the art, the inventors have presented an apparatus and a method for making diffusion barriers and seed layers in a single processing chamber. The exemplary apparatus includes a wafer-processing chamber having equipment for chemical-vapor deposition and physical vapor deposition, while the exemplary method uses this chamber in a chemical-vapor-deposition mode to form a diffusion barrier and in a physical-vapor deposition mode to form a seed layer. Forming the diffusion barrier and seed layer in a single chamber not only skips the conventional step of transporting the wafer from one chamber to another to form the seed layer, but also avoids the attendant risk of contamination during transport.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

What is claimed is:

1. A processing chamber for one or more integrated-circuit assemblies, comprising:
    a vacuum chamber including a substrate holder, at least one sputtering target, a plasma power source;
    a gas emission device selectively connected to a plurality of gaseous material sources, a heater;
    a gas emission device disposed adjacent the sputtering target; and
    a non-reactive gas source disposed operatively to sweep non-reactive gas across the sputtering target to prevent contamination during operation of the gas emission device selectively connected to a plurality of gaseous material sources.

2. The processing chamber of claim 1, wherein the at least one sputtering target includes at least one material from the list comprising copper, silver, gold, tungsten; and
    at least one of the gaseous material sources includes at least one material from the list comprising oxygen, nitrogen, aluminum, silicon, germanium, copper, silver, gold.

3. The processing chamber of claim 1, wherein the gas emission device selectively connect to the plurality of gaseous material sources is enabled to chemical vapor deposit at least one of a graded composition of $WSi_x$, where x varies from 2.0 to 2.5, and nitrided graded $WSi_xN_y$.

4. The processing chamber of claim 1, wherein the gas emission device selectively connected to the plurality of gaseous material sources includes an ECR device to excite a plasma including argon gas.

5. The processing chamber of claim 1, further comprising at least one of a movable shutter disposed adjacent the at least one sputtering target, an isolation valve positioned in an inlet into the chamber, or the sputtering target disposed below the substrate holder.

6. The processing chamber of claim 3, wherein the gas emission device selectively connected to the plurality of gaseous material sources is adapted to deposit tungsten by introducing tungsten hexafluoride and hydrogen gases, introducing silane gas, and terminating introduction of silane gas before terminating introduction of tungsten hexafluoride and hydrogen gases.

7. The processing chamber of claim 1, wherein the gas emission device selectively connected to the plurality of gaseous material sources includes a plurality of mass flow-controllers, and include a $WF_6$ source, a $SiH_4$ source, and an $N_2$ source.

8. A processing chamber for one or more integrated-circuit assemblies, comprising:
    a sputter target within the chamber;
    a plasma generator within the chamber;
    a chemical vapor deposition system within the chamber;
    a movable shutter disposed to isolate the plasma generator during operation of the chemical vapor deposition system; and
    a gas source adapted to sweep the sputter target for preventing contamination of the sputter target during operation of the chemical vapor deposition system.

9. The processing chamber of claim 8, wherein the gas source includes at least one of one or more turns of electrically conductive tubing and an RF emission coil.

10. A processing chamber for one or more integrated-circuit assemblies, comprising:
    a wafer holder for holding a wafer or substrate;
    means for sputtering a material onto a surface of a wafer held by the wafer holder, including:
        one or more sputter-target holders within the chamber for holding a sputter target; and
        a plasma source coupled to the chamber;
    means for vapor-depositing a material, including:
        one or more mass-flow controllers coupled to the chamber; and
        a gas-emission tube coupled to at least one of the mass-flow controllers and
        having one or more orifices oriented for emitting gas toward a sputter target held by the one or more sputter target holders; and
    a non-reactive gas source disposed operatively to sweep non-reactive gas across the sputtering target to prevent contamination during operation of the means for vapor-depositing a material.

11. The processing chamber of claim 10, wherein the gas-emission tube comprises a coiled tube having one or more turns.

12. The processing chamber of claim 11, further comprising a single vacuum chamber, a sputtering target holder within the chamber below the wafer holder, an electron-cyclotron-resonance plasma source coupled to the chamber, and at least one mass-flow controller coupled to the chamber.

13. The processing chamber of claim 12, wherein the vacuum chamber includes walls of at least one of stainless steel and glass.

14. The processing chamber of claim 12, wherein the chamber includes an RF-gas emission coil below the sputtering target holder.

15. The processing chamber of claim 14, wherein the coil includes a horizontal spiral.

16. The processing chamber of claim 14, wherein the coil includes two turns of 6.5 millimeter tubing.

17. The processing chamber of claim 12, wherein the sputtering target holder is adapted to provide a bias voltage to a target.

18. The processing chamber of claim 12, wherein the plasma source includes an isolation valve adapted to selectively isolate the plasma source from the chamber.

19. A processing chamber for one or more integrated-circuit assemblies, comprising:
    a vacuum chamber including a substrate holder, at least one sputtering target including at least one material from the list comprising copper, silver, gold, tungsten;
    a plasma power source selected from a capacitive radio frequency generator, an inductive radio frequency generator, and an ECR device, to excite a plasma;
    a gas emission device selectively connected to a plurality of gaseous material sources including at least one material from the list comprising oxygen, nitrogen, hydrogen, argon, aluminum, silicon, germanium, copper, silver, gold, tungsten, and enabled to mix gaseous material sources to chemical vapor deposit at least one of a graded composition of $WSi_x$, where x varies from 2.0 to 2.5, and nitrided graded $WSi_x$; and
    a gas emission device disposed adjacent the sputtering target, the gas emission device disposed adjacent the sputtering target disposed to sweep a non-reactive gas source across the sputtering target during operation of the gas emission device selectively connected to a plurality of gaseous material sources.

20. The processing chamber of claim 19, further comprising at least one of a movable shutter disposed adjacent the at least one sputtering target, an isolation valve positioned in an inlet into the chamber, or the sputtering target disposed below the integrated circuit assemblies.

21. The processing chamber of claim 20, wherein the gas emission device selectively connect to the plurality of gaseous material sources includes a heater, mass flow gas controllers, and a timer to deposit tungsten by introducing a selected flow of tungsten hexafluoride ($WF_6$) and hydrogen gases ($H_2$), introducing a selected flow of silane gas ($SiH_4$), and terminating introduction of silane gas before terminating introduction of tungsten hexafluoride and hydrogen gases.

* * * * *